(12) United States Patent
Meltzer (10) Patent No.: US 7,558,342 B2
(45) Date of Patent: Jul. 7, 2009

(54) CIRCUITS AND METHODS FOR ACQUIRING A FREQUENCY OF A DATA BITSTREAM

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 643 days.

(21) Appl. No.: 11/228,990

(22) Filed: Sep. 16, 2005

(65) Prior Publication Data
US 2007/0064837 A1 Mar. 22, 2007

(51) Int. Cl.
*H04L 27/00* (2006.01)
(52) U.S. Cl. .................... 375/326; 375/376
(58) Field of Classification Search ................. 375/375, 375/376, 294, 326–327
See application file for complete search history.

(56) References Cited

U.S. PATENT DOCUMENTS

| | | | | |
|---|---|---|---|---|
| 5,525,935 A | * | 6/1996 | Joo et al. ............... | 331/11 |
| 5,566,204 A | * | 10/1996 | Kardontchik et al. ....... | 375/219 |
| 6,331,792 B1 | | 12/2001 | Tonietto | |
| 6,438,178 B1 | | 8/2002 | Lysdal et al. | |
| 6,496,555 B1 | * | 12/2002 | Soda .................. | 375/376 |
| 6,807,225 B1 | * | 10/2004 | Tonietto et al. ........... | 375/219 |
| 6,856,206 B1 | | 2/2005 | Perrott | |
| 7,089,444 B1 | * | 8/2006 | Asaduzzaman et al. ..... | 713/600 |
| 2003/0142775 A1 | * | 7/2003 | Takeshita et al. ........... | 375/376 |
| 2005/0058235 A1 | * | 3/2005 | Beeson et al. .............. | 375/376 |
| 2005/0135510 A1 | * | 6/2005 | Momtaz .................... | 375/340 |
| 2005/0190873 A1 | * | 9/2005 | Smith et al. ................ | 375/354 |
| 2005/0242890 A1 | * | 11/2005 | Wu et al. .................... | 331/18 |
| 2005/0264330 A1 | * | 12/2005 | Li ............................... | 327/156 |

* cited by examiner

*Primary Examiner*—Emmanuel Bayard (57) ABSTRACT

Circuits and methods for recovering a periodic signal from a data signal. One circuit generally includes (1) a recovery circuit configured to produce a reference signal from the data signal, (2) a frequency detector circuit configured to produce a detector output in response to the reference signal and a recovered periodic signal, (3) a decision circuit configured to produce a decision output in response to the detector output and the recovered periodic signal (or a periodic derivative of that signal), and (4) a charge pump configured to produce a pump output, where the level of the pump output corresponds to a value of the decision output. The circuits and methods generally include those that embody one or more of the inventive concepts disclosed herein. The present invention advantageously provides smooth signal acquisition without use of an external clock.

24 Claims, 7 Drawing Sheets

CIRCUITS AND METHODS FOR ACQUIRING A FREQUENCY OF A DATA BITSTREAM

FIELD OF THE INVENTION

The present invention generally relates to the field of clock and data recovery loops. More specifically, embodiments of the present invention relate to circuits and methods to assist frequency acquisition of an incoming data stream.

DISCUSSION OF THE BACKGROUND

A clock and data recovery (CDR) loop is used to recover an embedded clock from an incoming serial data stream. Conventionally this requires that the frequency of a locally generated clock signal (the "recovered clock") be close to the fundamental frequency of the data stream (i.e., the frequency corresponding to the bit rate). This can be difficult for non-return-to-zero (NRZ) coded data streams, because there is generally no energy at the fundamental data frequency. NRZ streams do not have a rest state that signifies a transition.

Figure 1:
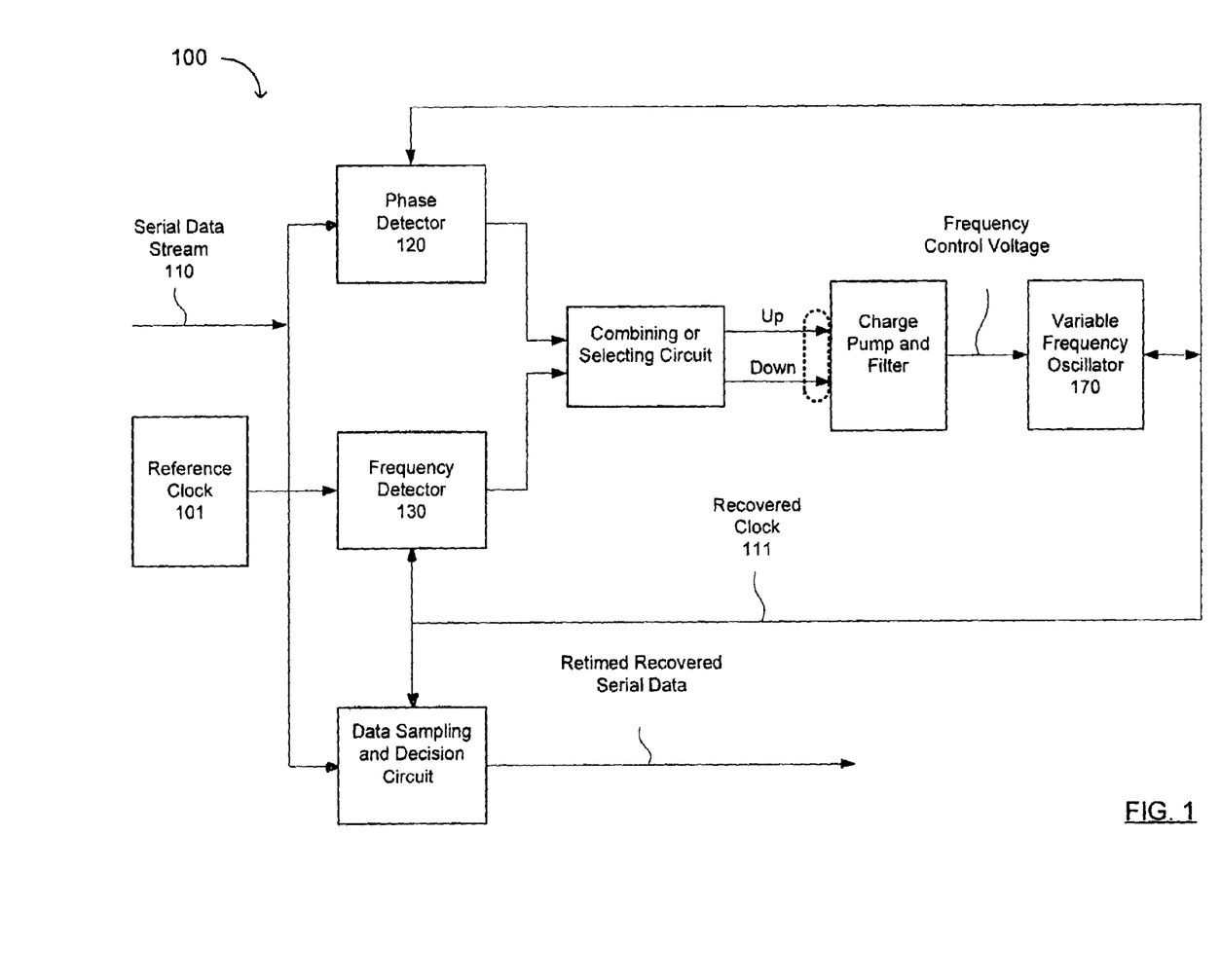
FIG. 1 is a diagram showing a conventional clock and data recovery (CDR) loop.

Referring to FIG. 1, in a conventional structure 100 that includes a phase locked (PLL) loop and is used for serial data stream clock and data recovery, a reference clock signal from a reference clock 101 is generated at about the fundamental frequency of serial data stream 110. Reference clock 101 is generally local to loop 100 and is used with frequency detector 130 to initially pull-in the PLL. Frequency detector 130 and a phase detector 120 are used with the PLL to generate a signal tuned to match the incoming data. Once lock is achieved, control of the loop frequency is done by phase detector 120 (e.g., an Alexander or Hogge style phase detector), which generally tracks transitions in the incoming data stream.

The need for the reference clock at the data fundamental frequency adds to the system cost and complexity. It is therefore desirable to have a frequency adjustment mechanism, which does not require such a clock.

Returning now to FIG. 1, phase detector 120 of loop 100 will generally lock to the incoming data stream if the frequency of variable frequency oscillator (VFO) 170 is sufficiently close to the fundamental frequency of data stream 110. Therefore, any auxiliary frequency adjustment mechanism (e.g., reference clock 101 and frequency detector 130) need not result in an exact frequency lock, but rather just bring the recovered clock close to the data stream's fundamental frequency.

Figure 2:
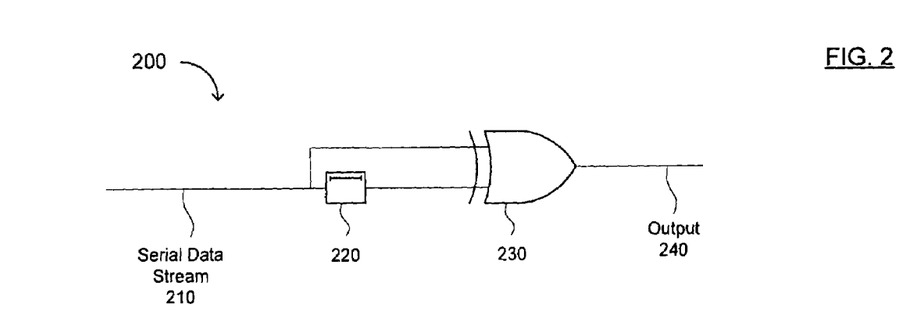
FIG. 2 is a diagram showing a conventional fundamental frequency energy recovery circuit.

Some fundamental frequency energy can be extracted from the serial data input stream 110 by differentiating and squaring the signal. FIG. 2 shows a conventional implementation of a circuit 200 configured to perform such a process to generate an output 240. Serial data input stream 210 may be coupled to both one input of exclusive-or (XOR) element 230 and to digital delay element 220. The output of delay element 220 may be coupled to the second input of XOR 230. In the conventional approach, the delay value of element 220 should be very small to get close to ideal differentiation.

Figure 3:
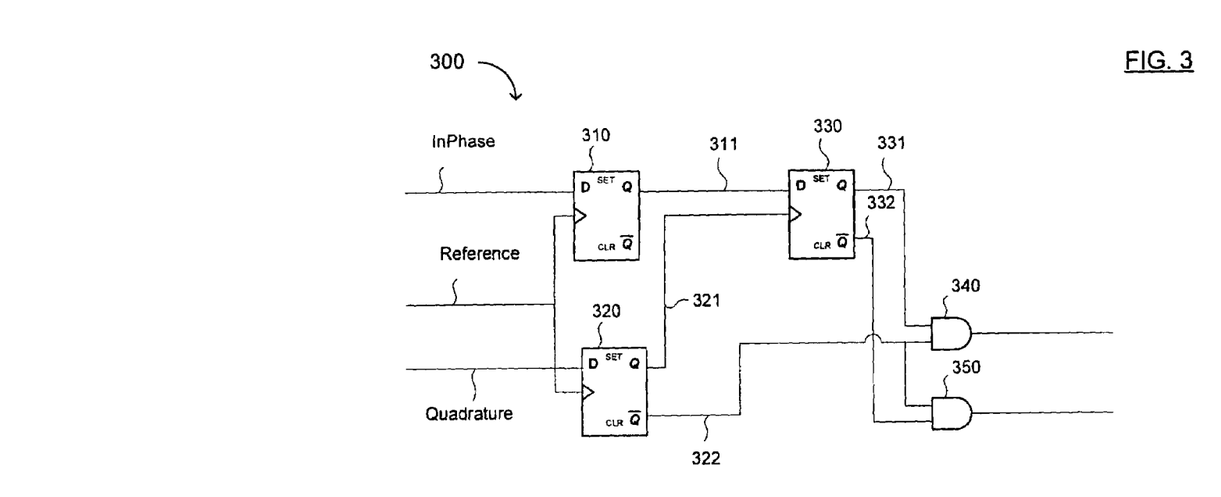
FIG. 3 is a diagram showing a conventional frequency detector.

FIG. 3 shows a conventional frequency detector. This detector compares the frequency of the reference input to the frequency of the in-phase and quadrature local clock using the conventional rotational detection algorithm. This detector advantageously decreases the rate of correction pulses as the two frequencies come closer together. However, it has the disadvantage that missing pulses on one of the inputs may distort the output pulses (e.g., UP/DOWN in FIG. 1) by lengthening them for the duration of the missing pulse.

In view of the foregoing problems with conventional clock and data recovery loops, the present invention provides improvements in this area of technology.

SUMMARY OF THE INVENTION

Embodiments of the present invention relate to circuits and methods to assist frequency acquisition of an incoming data stream. The initial frequency acquisition circuit generally comprises (1) a recovery circuit configured to produce a reference signal from the data signal, (2) a frequency detector circuit configured to produce a detector output in response to the reference signal and a recovered periodic signal, (3) a decision circuit configured to produce a decision output in response to the detector output and the recovered periodic signal (or a periodic derivative of that signal), and (4) a charge pump configured to produce a pump output, where the level of the pump output corresponds to a value of the decision output. Other embodiments of the present invention relate to a clock and data recovery (CDR) loop comprising the initial frequency acquisition circuit. The method generally comprises the steps of (1) producing a reference signal from a data signal, (2) comparing the reference signal to a recovered clock signal to produce a correction pulse, and (3) controlling or adjusting an oscillator frequency in response to the correction pulse and said recovered clock signal (and/or or a derivative thereof).

The present invention advantageously provides stable acquisition of the fundamental frequency of an incoming data stream without requiring the use of an external reference signal generator. This and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For convenience and simplicity, the terms "clock," "time," "rate," "period" and "frequency" are generally interchangeable herein, but are generally given their art-recognized meanings. Also, for convenience and simplicity, the terms "data," "signal," "waveform" and "information" may be used interchangeably, as may the terms "connected to," "coupled with," "coupled to," and "in communication with," which may refer to direct and/or indirect connections and/or couplings, as the case may be, but these terms are generally given their art-recognized meanings.

The present invention allows the use of the output of the circuit of FIG. 2 as the reference input to the frequency detector of FIG. 3 to create a mechanism for adjusting the frequency of the recovered clock of a CDR loop. Typically, the nature of the input data stream (e.g., an NRZ coded data stream), when processed by frequency recovery circuit 200, creates a reference input to detector circuit 300 a significant number of pulses may be missing. Advantageously, the present invention combines aspects of the circuits in FIGS. 2 and 3 to mitigate the unwanted effects of these missing pulses.

The present invention concerns circuits and methods for recovering a periodic signal from a data signal. The frequency acquisition circuit for recovering a periodic signal from a data signal generally includes (1) a recovery circuit configured to produce a reference signal from the data signal, (2) a frequency detector circuit configured to produce a detector output in response to the reference signal and a recovered periodic signal, (3) a decision circuit configured to produce a decision output in response to the detector output and the recovered periodic signal (or a periodic derivative of that signal), and (4) a charge pump configured to produce a pump output, where the level of the pump output corresponds to a value of the decision output.

The invention further relates to a clock and data recovery (CDR) loop comprising (1) a recovery circuit configured to produce a reference signal from a data signal; (2) a frequency detector circuit configured to produce a detector output in response to the reference signal and a recovered clock signal; (3) a decision circuit configured to produce a decision output in response to the detector output and the recovered periodic signal (or a periodic derivative thereof); (4) a phase detector producing a phase correction output in response to the data signal and the recovered clock signal; (5) a charge pump configured to produce a pump output in response to the phase correction output and/or the decision output; and (6) a variable oscillator configured to produce the recovered clock signal in response to the pump output.

In a further embodiment, the invention relates to a method for recovering a periodic signal from a data signal, comprising the steps of (I) producing a reference signal from the data signal, (II) comparing the reference signal to a recovered clock signal to produce a correction pulse; and (III) controlling or adjusting an oscillator frequency in response to the correction pulse and the recovered clock signal or a derivative thereof.

The invention, in its various aspects, will be explained in greater detail below with regard to exemplary embodiments.

An Exemplary Frequency Acquisition Circuit

Figure 4A:
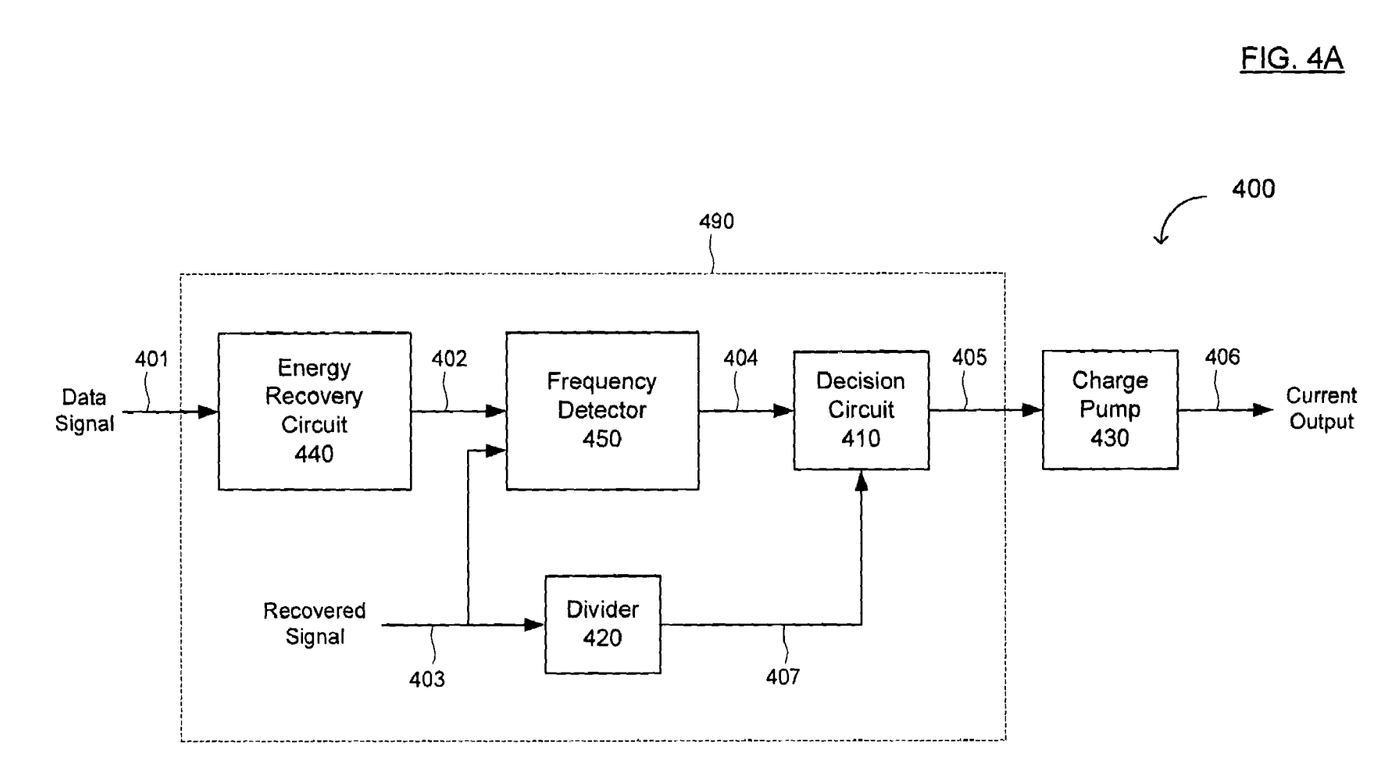
FIG. 4A is a block diagram showing a circuit for recovering a periodic signal from a data signal according to the present invention.

FIG. 4A shows a first exemplary embodiment of the circuit 400 for recovering a periodic signal from data signal 401. The circuit includes (1) recovery circuit 440 configured to produce reference signal 402 from data signal 401, (2) frequency detector circuit 450 configured to produce a detector output 404 in response to reference signal 402 and a recovered periodic signal 403, (3) decision circuit 410 configured to produce decision output 405 in response to detector output 404 and either recovered periodic signal 403 or a periodic derivative thereof (e.g., divided period signal 407, discussed herein), and (4) charge pump 430 configured to produce pump output 406, the level of which corresponds to a value of decision output 405.

In one aspect of the invention, data signal 401 may comprise non-return-to-zero (NRZ) encoded data. It is well within the abilities of one skilled in the art to design and use the invention on data signals with other encodings (e.g. NRZI or Miller coded data).

In a further embodiment, the periodic signal recovery circuit 400 includes divider circuit 420, configured to divide recovered signal 403 to produce divider output 407. Divider 420 may be further configured to divide said recovered periodic signal by n, n being an integer of greater than 1 (preferably equal to 4).

In another aspect, energy recovery circuit 440 may comprise a pulse generator, and reference signal 402 may comprise a reference pulse. The pulse generator may comprise a recovery circuit, e.g., circuit 200 of FIG. 2 (see, e.g., energy recovery circuit 440' of FIG. 4B). Thus, recovery circuit 440 may comprise a delay element (e.g., element 220) and a logic element (e.g., element 230) configured to receive a data signal (e.g., signal 210), the logic element being further configured to receive an output of the delay element, and to produce the reference signal e.g., reference signal 402 of FIG. 4A). The delay value of the delay element should generally be small relative to the period of the data signal to get ideal differentiation. It is desirable that the delay value be close to, but less than half of, the fundamental period of the data signal.

Recovery circuit 440 may be configured to assist a CDR loop to recover a fundamental frequency of the incoming data signal. For an NRZ data stream, each transition of the data stream will result in one cycle of the fundamental data frequency. The amount of energy at this frequency is dependent on the transition density of the data stream.

Figure 5A:
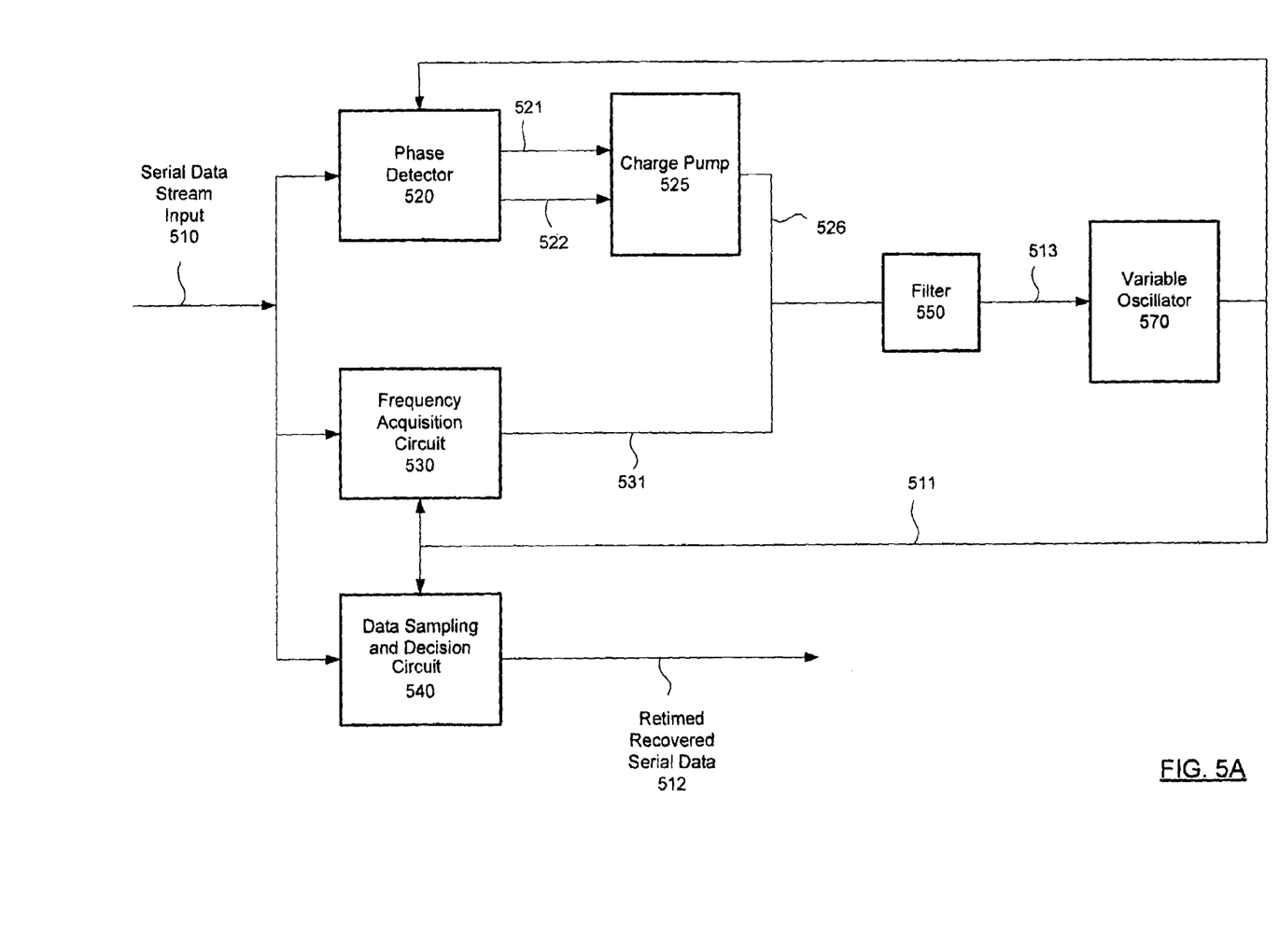
FIG. 5A is a diagram showing a CDR loop according to the present invention.
Figure 5B:
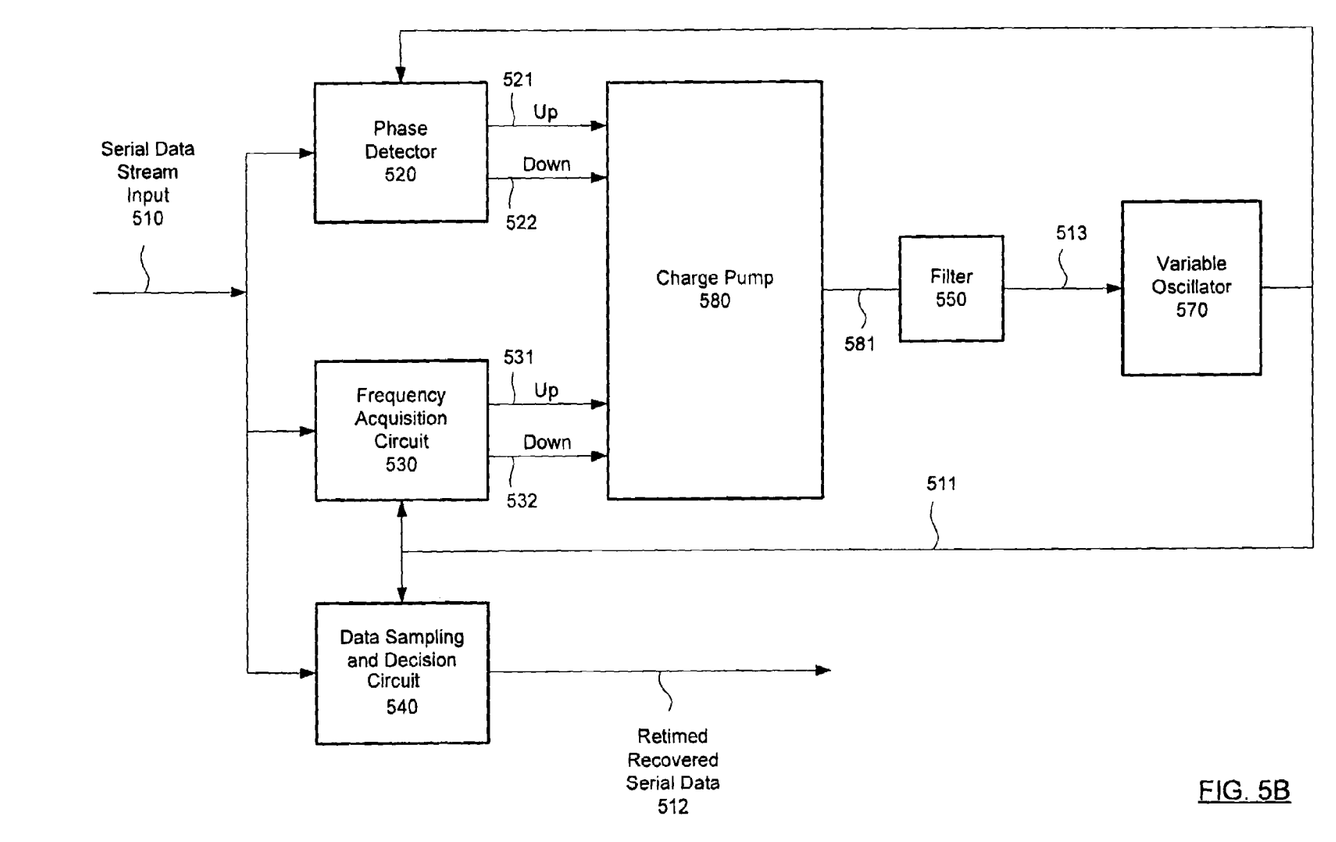
FIG. 5B is a diagram showing an alternative embodiment of a CDR loop according to the present invention.

In another embodiment, frequency detector 450 further produces detector output 404 in response to a quadrature signal in quadrature with recovered clock signal 403. That is, the frequency detector 450 may use both in-phase and quadrature derivatives of recovered clock signal 403. A quadrature derivative of recovered clock signal 403 may be generated within frequency detector circuit 450, but is more preferably an output of the same circuit, which produces recovered clock signal 403 (e.g., variable frequency oscillator (VFO) 570 of FIG. 5A/B, discussed herein).

In a further embodiment, frequency detector 450 produces detector output 404 by performing a rotational detection algorithm on a reference signal (e.g., output 402 of energy recovery circuit 440, which may comprise a squared and differentiated signal derived from the data signal) and on a recovered clock signal (e.g., recovered signal 403) and/or one or more copies or derivatives thereof (e.g., in-phase and/or quadrature copies of the recovered signal).

Figure 4B:
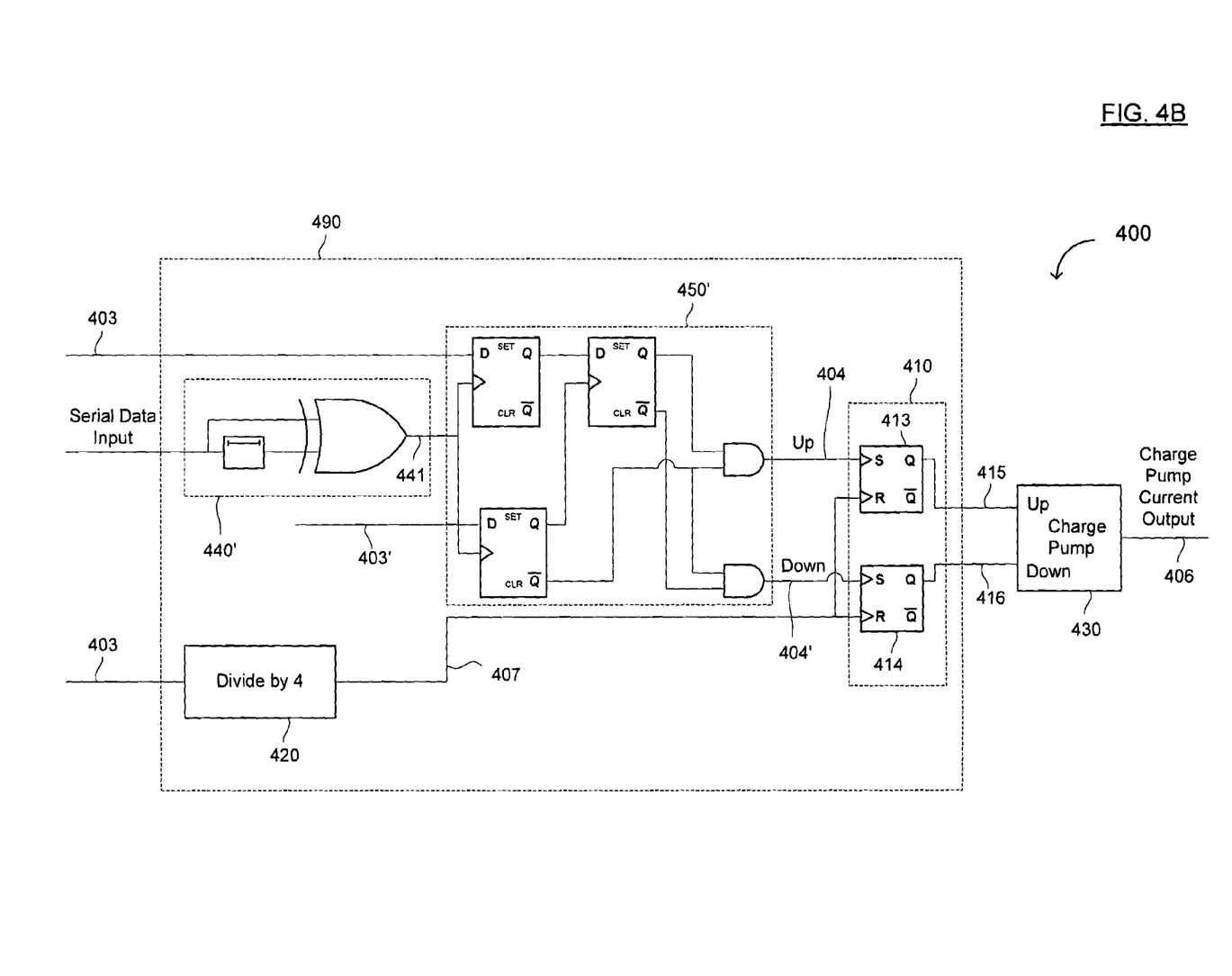
FIG. 4B is a diagram showing a detailed circuit for recovering a periodic signal from a data signal according to the present invention.

Referring now to FIG. 4B, the frequency detector may be that of frequency detector 450', which may comprise a circuit similar to the conventional frequency detector 300 of FIG. 3, except that frequency detector 450' generally receives a locally generated reference signal (e.g., output signal 402 of recovery circuit 440 [FIG. 4A] or output signal 441 of recovery circuit 440' [FIG. 4B]), instead of receiving externally generated reference signal 302 [FIG. 3]. Thus, frequency detector 450' may comprise (1) a first storage or logic element (e.g., 310) receiving a first recovered clock signal (e.g., recovered clock signal 403) and a reference signal (e.g., 441), and provide a first output (e.g., 311 or 404).

The frequency detector may further comprise (i) a second storage or logic element (e.g., 320) receiving a quadrature copy 403' of recovered clock signal 403 and a reference signal (e.g., signal 402 of FIG. 4A or signal 441 of FIG. 4B), and provide a second output (e.g., 321); and (ii) a third storage or logic element (e.g., 330) receiving first output 311 and second output 321, and providing a third output (e.g., 331). Frequency detector 450' may further produce a complementary second output (e.g., 322 or 404') of second storage or logic element 320 and a complementary third output (e.g., 332) of third storage or logic element 330.

In a further embodiment, the frequency detector may also comprise a first logic gate (e.g., 340) configured to receive third output 331 and complementary second output 322, and output first detector output 404; and a second logic gate (e.g., 350) configured to receive complementary second output 322 and complementary third output 332, and provide second detector output 404'. In a preferred embodiment, storage or logic elements 310, 320, and 330 are conventional set/reset elements (e.g., latches). In a further preferred embodiment, logic gates 340 and 350 comprise AND gates or their logical equivalent.

In another embodiment, a decision circuit (e.g., block 410 of FIGS. 4A/B) is generally configured to limit the maximum pulse width of the frequency correction pulses generated by the frequency detector. The decision circuit is generally configured to receive both the UP and DOWN outputs (e.g., outputs 404 and 404' of FIG. 4B) of the frequency detector, and produces corresponding UP and DOWN outputs (e.g. outputs 415 and 416 of FIG. 4B). The decision circuit may further limit the duration of either of those signals to the period of a (divided) recovered clock signal. Therefore, if the recovered clock signal is divided by 4, neither the UP nor the DOWN outputs of the decisions circuit will last longer than 4 recovered clock cycles.

Referring now to FIG. 4B, decision circuit 410 may comprise first set/reset circuit 413 having a first input coupled to the first detector output (e.g., detector output 404), a second input coupled to divider output 407, and an output coupled to first decision output 415; and second set/reset circuit 414 having a first input coupled to a second detector output (e.g., 404'), a second input coupled to the divider output 407, and an output coupled to second decision output 416. This configuration generally serves to limit the duration of up or down control signals to charge pump 430 to the period of divided output 407. In a preferred embodiment, this period is 4 times the period of recovered clock signal 403.

In a further embodiment, the invention relates to an integrated circuit comprising the above-described frequency correction circuit. This integrated circuit does not necessarily employ (and may advantageously omit) an external reference clock (e.g., a relatively high cost crystal oscillator component) and/or associated circuitry for distributing high speed clock signals.

An Exemplary Clock and Data Recovery Circuit

An exemplary embodiment of the present invention concerns a clock and data recovery (CDR) loop that includes the inventive frequency acquisition circuit described above, a phase detector, and a variable oscillator configured to produce a recovered periodic signal in response to both the phase detector and the frequency acquisition circuit. The frequency acquisition circuit will generally pull the oscillator close to the frequency of the data input stream. The phase detector will generally adjust the oscillator when the frequency of the recovered clock signal is near the data frequency of the data input stream.

Therefore, in one aspect the invention relates to a clock and data recovery (CDR) loop including (1) a recovery circuit configured to produce a reference signal from a data signal; (2) a frequency detector circuit (e.g., frequency detector 300/450) configured to produce a detector output in response to the reference signal and a recovered clock signal; (3) a phase detector (e.g., phase detector 520) producing a phase correction output in response to the data signal and the recovered clock signal; and (4) a variable oscillator (e.g., variable oscillator 570) configured to produce said recovered clock signal in response to the phase correction output and either the detector output or a derivative thereof.

Referring now to FIG. 5A, CDR loop may include frequency acquisition circuit 530 (which may comprise circuit 400 of FIGS. 4A/B or circuit 490 which may exclude the charge pump 430). The frequency acquisition circuit generates output 531, generally corresponding to output 406 of FIGS. 4A/B. The CDR loop may further include phase detector 520 producing a phase correction output 521/522 in response to data signal 510 and recovered clock signal 511; charge pump 525 configured to produce pump output 526 in response to phase correction output 521/522; and variable oscillator 570 configured to produce recovered clock signal 511 in response to pump output 526 and/or output 531.

In a further aspect, the CDR loop may include a decision circuit (e.g., decision circuit 410) configured to produce a decision output in response to the detector output and either the recovered clock signal or a periodic derivative thereof, and the variable oscillator may be further configured to produce the recovered clock signal in response to the decision output. The decision circuit generally limits the maximum pulse width of the frequency correction pulses generated by the frequency detector. The decision circuit is generally configured to receive both the UP and DOWN outputs (e.g., outputs 404 and 404' of FIG. 4B) of the frequency detector, and produce corresponding UP and DOWN outputs (e.g., outputs 415 and 416 of FIG. 4B). The decision circuit may further limit the duration of the signals 415 and/or 416 to the period of a (divided) recovered clock signal.

In yet another aspect of the invention, the CDR loop may include (1) a first charge pump (e.g., charge pump 430) configured to produce a first pump output in response to the detector output or a derivative thereof; (2) a second charge pump (e.g., charge pump 525) configured to produce a second pump output in response to the phase correction output; and (3) a filter (e.g., filter 550) configured to filter the first and second charge pump outputs. The variable oscillator may be further configured to produce said recovered clock signal in response to said filter output.

Alternatively, a single charge pump (e.g., charge pump 580 of FIG. 5B) may be configured to produce charge pump output 581 in response to phase detector output 521/522 and/or frequency acquisition output 531/532. In this configuration, frequency detector 530 may comprise frequency acquisition circuit 490 of FIG. 4B, which does not include a charge pump. This configuration may result in some cost savings, as each charge pump generally requires a relatively large circuit/die area, but it may be less flexible and/or precise than desired for certain applications, in which case the two-charge-pump circuit of FIG. 5A can be advantageous.

Referring again to FIG. 5A, a further embodiment of the CDR loop may further comprise data sampling circuit 540 configured to produce re-clocked serial data stream 512 in response to incoming data signal 510 and recovered clock signal 511. In another aspect of the invention, the recovery circuit may comprise a pulse generator; and the reference signal may comprise a reference pulse.

Note that phase detector 520 and data sampling circuit 540 may be combined into Hogge or Alexander style phase detectors with data samplers. Phase detector 520 generates frequency up and down signals 521/522, which drive charge pump 525. The output current of charge pump 525 may be coupled to a low pass filter 550 to stabilize the loop. The current output of circuit 530 (see, e.g., the frequency acquisition circuit[s] of FIGS. 4A/B) also may be coupled to the input of filter 550, effectively adding the two currents. An important aspect of this configuration is that, unlike the loop of FIG. 1, there is no need for complex circuitry to select between the outputs of charge pump 525 and frequency acquisition circuit 530. The input to the filter can be the sum of both output currents. The output 513 of filter 550 is generally a voltage, which provides a control voltage (or, after suitable conversion, an input current) for variable oscillator 570. The output of variable oscillator 570 is the recovered clock signal 511. This signal 511 (or a derivative thereof, such as a multiplied and/or divided recovered clock signal, and/or an in-phase or quadrature copy of the signal) may be used by data sampler 540 to sample the incoming data stream and generate retimed recovered serial data 512.

Also note that the gain (i.e., output current) of the charge pump of frequency acquisition circuit 530 should generally be high in order pull in the loop (i.e., bring the frequency of the recovered clock signal close to the data frequency of the data input stream). However, when near lock or in lock, the output current of charge pump 525 should generally control the loop. Limiting the duration of current pulses of circuit 530 (by limiting the time duration of high/low outputs of the frequency detector) generally improves the operation of the loop. When the loop is far from lock, the output of phase detector 520 is generally random, resulting in substantially no net output current from charge pump 525. The output of frequency acquisition circuit 530 may comprise many pulses of limited duration. More specifically, the duration of these pulses may be limited to an integer multiple of the period of the recovered clock signal (e.g. 4n recovered clock periods, n being an integer of at least 1). The net current pulls the loop in the correct direction. When lock is approached, the number of pulsed outputs of frequency acquisition circuit 530 generally decreases, limiting the gain and allowing phase detector 520 to control the loop. Due to missing pulses in the differentiated data stream (e.g., an NRZ data stream) the output of frequency acquisition circuit 530 generally does not disappear but is limited by the circuit of FIGS. 4A/B to an acceptable level.

In a further embodiment, an integrated circuit may then be formed comprising the entire CDR loop, one or more control voltage generators (which may comprise a voltage regulator, a voltage divider, etc.), one or more frequency multipliers and/or dividers, one or more filters, a plurality of clock buffers (each of which may be three-statable), etc. Conventional CDR loops generally require the use of an external reference clock, e.g. a relatively high cost crystal oscillator component and/or associated circuitry for distributing high speed clock signals. This integrated circuit may advantageously omit such an external reference clock.

An Exemplary Method

The present invention further relates to a method for recovering a periodic signal from a data signal, comprising the steps of (1) producing a reference signal from the data signal, (2) comparing the reference signal to a recovered clock signal to produce a correction pulse; and (3) controlling or adjusting an oscillator frequency in response to the correction pulse and the recovered clock signal or a periodic derivative thereof. In a further embodiment, the method comprises the step of dividing the recovered clock signal to produce a divided clock signal, where the recovered clock signal or periodic derivative thereof comprises this divided clock signal. In a preferred embodiment, the comparing step may comprise performing a rotational detection algorithm.

In another embodiment, the reference signal producing step may comprise generating a pulse from a first transition of said data signal (e.g. using the squaring and differentiating circuit of FIG. 2). More specifically, this pulse may have a width less than or equal to half of the period of a frequency of the data signal.

In a preferred embodiment, the dividing step may divide the recovered clock signal by 4n, n being an integer of at least 1. In yet another embodiment the controlling or adjusting step may comprise applying a high or low control signal to the oscillator. The high and low signals may have a duration of less than or equal to the period of the recovered clock signal or derivative thereof.

Results

Figure 6:
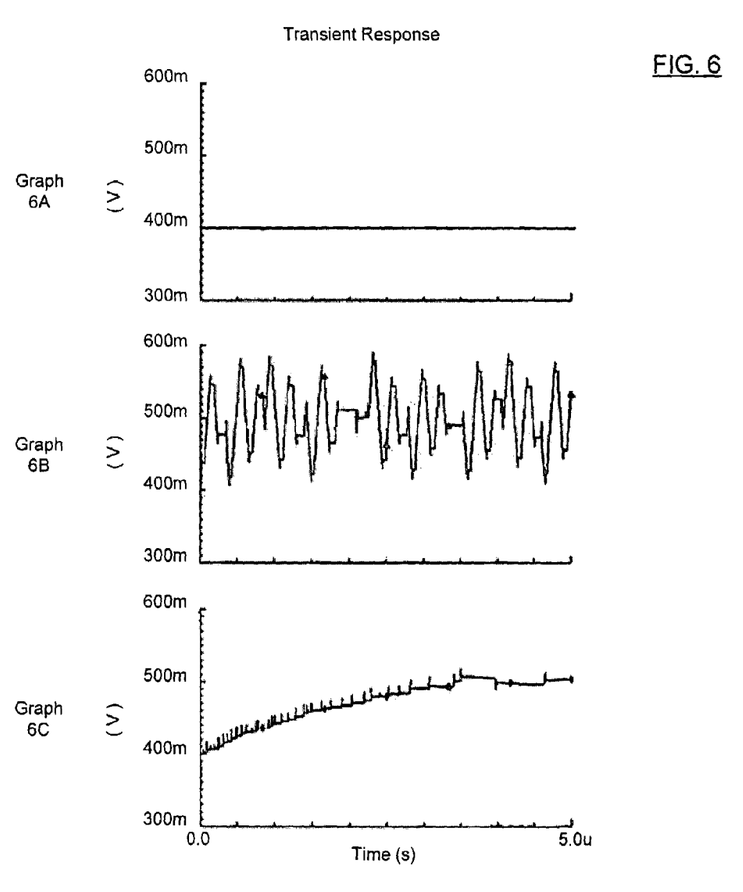
FIG. 6 is a set of graphs showing the voltage response of a conventional CDR loop and of CDR loops according to the present invention.

FIG. 6 shows the simulation results of three cases. Plots of the filter (the VCO control voltage) with an initial condition set to 0.4V. Data is transmitted at 1 Gbps with a pattern equal to the 8b/10b code K28.5 (i.e., 0011111010). The VCO generally is configured to oscillate at 1 GHz when the control voltage equals 0.5V. Ideal behavior would be a smooth curve from 0.4 to 0.5V, followed by a constant 0.5V.

Graph 6A shows the behavior of the unassisted phase detector with low gain. Random output prevents any significant change in voltage. It is expected to never achieve lock.

Graph 6B shows the results from same loop as 6A, with the circuit of FIG. 2 coupled to the reference input of the circuit of FIG. 3, used as a lock assist. The control voltage rapidly gets to 0.5V but then the effect of the missing data pulses causes a wide swing of the control voltage. It is expected, however, that lowering the pass-band of the filter may help this but may affect the data tracking ability of the loop when the phase detector is in control.

Graph 6C shows the response of the CDR loop of 6B, further including a decision circuit (i.e. decision circuit 410 of FIG. 4B). This optimal circuit shows a near ideal response with only a small amount of noise on the control voltage in lock.

CONCLUSION/SUMMARY

Thus, the present invention provides circuits and methods for recovering the fundamental frequency of an input data stream. The initial frequency acquisition circuit generally comprises (1) a recovery circuit configured to produce a reference signal from the data signal, (2) a frequency detector circuit configured to produce a detector output in response to the reference signal and a recovered periodic signal, (3) a decision circuit configured to produce a decision output in response to the detector output and the recovered periodic signal (or a periodic derivative of that signal), and (4) a charge pump configured to produce a pump output, where the level of the pump output corresponds to a value of the decision output. Other embodiments of the present invention relate to a clock and data recovery (CDR) loop comprising the initial frequency acquisition circuit. The method generally comprises the steps of (1) producing a reference signal from a data signal, (2) comparing the reference signal to a recovered clock signal to produce a correction pulse, and (3) controlling or adjusting an oscillator frequency in response to the correction pulse and said recovered clock signal (and/or or a derivative thereof).

The present invention advantageously provides stable acquisition of the fundamental frequency of an incoming data stream without requiring the use of an external reference signal generator.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit for recovering a periodic signal from a data signal, the circuit comprising:
    a variable oscillator for producing an oscillating signal, said variable oscillator being effective for varying the frequency of said oscillating signal in response to a frequency control input;
    a logic transition detector circuit receiving said data signal and configured to produce a pulse signal in response to logic transitions in said data signal;
    a frequency detector circuit receiving said pulse signal and said oscillating signal and producing an intermediate-frequency-difference signal indicative of a frequency difference between said pulse signal and said oscillating signal;
    a pulse length limiter circuit receiving said intermediate-frequency-difference signal, said pulse length limiter circuit being effective for limiting a pulse length of said intermediate-frequency-difference signal to a multiple of the pulse length of said oscillating signal, and outputting the pulse length limited version of said intermediate-frequency-difference signal as a frequency-difference output;
    said frequency control input of said variable oscillator being responsive to said frequency-difference output, and said variable oscillator being further effective for modulating the frequency of said feedback-oscillator signal in response to said frequency-difference output.

2. The circuit of claim 1, wherein said frequency detector lacks access to any local clock having a fundamental frequency matching the bit rate of said data signal.

3. The circuit of claim 1, wherein said pulse length limiter circuit includes a Set-Reset flip-flop (i.e. SR FF), said intermediate-frequency-difference signal is coupled to the Set input of said SR FF, a frequency multiple of said oscillating signal is coupled to the Reset input of said SR FF, and the true output of said SR FF is said frequency-difference output.

4. The circuit of claim 3, wherein said oscillating signal is coupled to a frequency divider to produce said frequency multiple of said oscillating signal, and the output of said frequency divider is coupled to said Reset input of said SR FF.

5. The circuit of claim 4, wherein said frequency divider has a value of divide-by-4.

6. The circuit of claim 1, wherein said logic transition detector circuit includes a delay circuit and an XOR logic gate;
    wherein
    said delay circuit receives said data signal and outputs a delayed-data signal; and
    said XOR gate having a first logic input receiving said data signal, a second logic input receiving said delayed-data signal, and an output for outputting said pulse signal in response to logic transitions in said data signal.

7. The circuit of claim 1, further comprising:
    a charge pump having an Up control input and a Down control input, said charge pump being effective for increasing and decreasing an output current in response to said up and down control inputs; and
    a filter receiving said current output and outputting said frequency-difference output;
    wherein:
    said frequency detector further outputs a complementary intermediate-frequency-difference signal that is the logic complement of said intermediate-frequency-difference signal; and
    said pulse length limiter circuit includes a first and second Set-Reset flip-flop (i.e. SR FF), said intermediate-frequency-difference signal is coupled to the Set input of said first SR FF, said complementary intermediate-frequency-difference signal is coupled to the Set input of said second SR FF, a frequency multiple of said oscillating signal is coupled to the Reset inputs of said first and second SR FFs, the true output of said first SR FF is coupled to said Up control input, and the true output of said second SR FF is coupled to said Down control input.

8. The circuit of claim 7, wherein said oscillating signal is coupled to a frequency divider to produce said frequency multiple of said oscillating signal, and the output of said frequency divider is coupled to said Reset inputs of said first and second SR FFs.

9. The circuit of claim 8, wherein said frequency divider has a value of divide-by-4.

10. The circuit of claim 8, wherein said logic transition detector circuit includes a delay circuit and an XOR logic gate;
    wherein
    said delay circuit receives said data signal and outputs a delayed-data signal; and
    said XOR gate having a first logic input receiving said data signal, a second logic input receiving said delayed-data signal, and an output for outputting said pulse signal in response to logic transitions in said data signal.

11. A clock recovery circuit for recovering a periodic signal from a data input signal, comprising:
    a variable oscillator for producing a feedback-oscillating signal whose frequency is varied in response to a frequency control input;
    a phase detector receiving said data input signal and said feedback-oscillating signal and producing a phase difference control output indicative of a phase difference between said data signal and feedback-oscillating signal;
    a logic transition detector circuit receiving said data input signal and configured to produce a pulse signal in response to logic transitions in said data input signal;
    a frequency detector circuit receiving said pulse signal and said feedback-oscillating signal and producing an intermediate-frequency-difference signal indicative of a frequency difference between said pulse signal and said feedback-oscillating signal;

a pulse length limiter circuit receiving said intermediate-frequency-difference signal, said pulse length limiter circuit being effective for limiting a pulse length of said intermediate-frequency-difference signal to a multiple of the pulse length of said feedback-oscillating signal, and outputting the pulse length limited version of said intermediate-frequency-difference signal as a frequency-difference control output;

said frequency control input of said variable oscillator being simultaneously responsive to both said phase difference control output and said frequency-difference control output.

12. The clock recovery circuit of claim 11, wherein said phase difference control output is summed with said frequency-difference control output to form a summed signal coupled to said frequency control input.

13. The clock recovery circuit of claim 12, wherein:
said phase difference control output is a first current signal;
said frequency-difference control output is second current signal; and
said first and second current signals are summed at a summation node to form said summed signal coupled to said frequency control input.

14. The clock recovery circuit of claim 11, wherein said frequency detector lacks access to any local clock having a fundamental frequency matching the bit rate of said data input signal.

15. The circuit of claim 11, wherein said pulse length limiter circuit includes a Set-Reset flip-flop (i.e. SR FF), said intermediate-frequency-difference signal is coupled to the Set input of said SR FF, a frequency multiple of said feedback-oscillating signal is coupled to the Reset input of said SR FF, and the true output of said SR FF is said frequency-difference control output.

16. The circuit of claim 15, wherein said feedback-oscillating signal is coupled to a frequency divider to produce said frequency multiple of said feedback-oscillating signal, and the output of said frequency divider is coupled to said Reset input of said SR FF.

17. The circuit of claim 16, wherein said frequency divider has a value of divide-by-4.

18. The clock recovery circuit of claim 11 further comprising a first and a second charge pump, each having a respective Up control input, a respective Down control input, and a respective pump output for increasing and decreasing its respective output current in response to its respective Up and Down control inputs;
wherein:
said phase difference control output of said phase detector is in the form of an Up-Phase control output coupled to the Up control input of said first charge pump and a Down-Phase control output coupled to the Down control input of said first charge pump;
said frequency-difference control output of said pulse length limiter circuit is in the form of an Up-Frequency control output coupled to the Up control input of said second charge pump and a Down-Frequency control output coupled to the Down control input of said second charge pump; and
the pump output of said first charge pump is tied to the pump output of said second charge pump a summation node to form a summed signal coupled to said frequency control input.

19. The clock recovery circuit of claim 18, wherein said summation node is coupled to said frequency control input through a filter.

20. The clock recovery circuit of claim 18, wherein:
said frequency detector outputs further outputs a complementary intermediate-frequency-difference signal that is the logic complement of said intermediate-frequency-difference signal; and
said pulse length limiter circuit includes a first and second Set-Reset flip-flop (i.e. SR FF), said intermediate-frequency-difference signal is coupled to the Set input of said first SR FF, said complementary intermediate-frequency-difference signal is coupled to the Set input of said second SR FF, a frequency multiple of said feedback-oscillating signal is coupled to the Reset inputs of said first and second SR FFs, the true output of said first SR FF is said Up-Frequency control output and the true output of said second SR FF is said Down-Frequency control output.

21. The circuit of claim 20, wherein said feedback-oscillating signal is coupled to a frequency divider to produce said frequency multiple of said feedback-oscillating signal, and the output of said frequency divider is coupled to said Reset inputs of said first and second SR FFs.

22. The circuit of claim 21, wherein said frequency divider has a value of divide-by-4.

23. The circuit of claim 11, wherein said logic transition detector circuit includes a delay circuit and an XOR logic gate;
wherein
said delay circuit receives said data input signal and outputs a delayed-data input signal; and
said XOR gate has a first logic input receiving said data input signal, a second logic input receiving said delayed-data input signal, and an output for outputting said pulse signal in response to logic transitions in said data input signal.

24. The circuit of claim 18, wherein said second charge pump is stronger than said first charge pump.

* * * * *